United States Patent [19]

Cooperman

[11] 4,255,715
[45] Mar. 10, 1981

[54] OFFSET CORRECTION CIRCUIT FOR DIFFERENTIAL AMPLIFIERS

[75] Inventor: Michael Cooperman, Framingham, Mass.

[73] Assignee: GTE Laboratories Incorporated, Waltham, Mass.

[21] Appl. No.: 70,192

[22] Filed: Aug. 27, 1979

[51] Int. Cl.³ .............................................. H03F 1/02
[52] U.S. Cl. ........................................ 330/9; 307/359
[58] Field of Search ............... 330/9, 51, 69; 307/352, 307/353, 359

[56] References Cited
U.S. PATENT DOCUMENTS 4,039,963  8/1977  Guillon et al. .......................... 330/9

Primary Examiner—James B. Mullins

Attorney, Agent, or Firm—Fred Fisher

[57] ABSTRACT

The output of a differential amplifier, operating as a comparator, is coupled through a first switch to charge a small valued capacitor $C_1$. The charge in the small capacitor can be coupled through a second switch to charge a larger value capacitor $C_2$. The charge on the larger capacitor creates a voltage thereacross which is $C_1/(C_1+C_2)$ that which was initially across capacitor $C_1$. The voltage across the capacitor $C_2$ is coupled to the negative terminal of the differential amplifier and is lessened in value via a buffer and attenuator circuit. The positive terminal is coupled to ground. The output of the comparator would normally have a polarity based upon the sign of the "offset error" of the comparator less the voltage at the negative terminal.

23 Claims, 4 Drawing Figures

OFFSET CORRECTION CIRCUIT FOR DIFFERENTIAL AMPLIFIERS

BACKGROUND OF THE INVENTION

1. Field of the Invention

This invention relates to offset correction circuits suitable for use with differential amplifiers, and, further, to combinations including differential amplifiers and offset correction circuits. Accordingly, it is a general object of this invention to provide new and improved circuits and combinations of such character.

2. Description of the Prior Art

Known offset correction circuits for MOS differential amplifiers do not correct to better than 5 millivolts accuracy. For greater accuracy of correction, large capacitances that were used mandated the use of off chip capacitors.

SUMMARY OF THE INVENTION

Another object of this invention is to provide new and improved offset correction circuits and combinations utilizing same which are more accurate than those known to the art.

Yet another object of this invention is to provide new and improved MOS offset correction circuits and combinations utilizing same which utilize fewer elements than similar MOS devices of the prior art.

In accordance with one embodiment of this invention, a combination includes an offset correction circuit and a differential amplifier. The differential amplifier has a first input terminal for receiving a signal $V_X$ and a second input terminal for receiving a signal $V_Y$. Its output terminal provides an output signal based upon the polarity of $(V_X - V_Y + V_Z)$, $V_Z$ being an offset error of the amplifier. The offset correction circuit includes a latching circuit coupled to receive the output signal and store its polarity, which latching circuit provides a positive latching signal upon receipt of an output signal of a first polarity from the amplifier and provides a negative latching signal upon receipt of an output signal of a second polarity from the amplifier. The offset correction circuit further includes two capacitors, each having one terminal coupled to a point of reference potential, the second capacitor having a capacitance $C_2$ which is larger than the capacitance $C_1$ of the first capacitor. Means are operative during a first time period for causing the first input terminal to be at a point of reference potential. Means are operative during a second time period for storing the polarity of the output signal. Means are operative during a third time period for charging the first capacitor, via its second terminal, with a latching signal from the latching circuit. Means are operative during a fourth time period for coupling the remaining terminals of the two capacitors together. The second capacitor is coupled through a buffer, which provides a low output impedance, through an attenuator to the second input terminal. In accordance with certain features of the invention, the positive and negative latching signals are each of the same fixed magnitude. The capacitance $C_2$ can be significantly higher than the capacitance $C_1$, in excess of 80 to 1, such as 100 or 500 to 1. The buffer can be a source follower. The attenuator includes two MOS transistors. The source electrode of the first transistor is coupled to the buffer output terminal. The source electrode of the first transistor is coupled both to the drain electrode of the second transistor and to the second input terminal. Both gate electrodes are adapted to be coupled to an activating potential. The four time periods are sequential and repetitive.

In accordance with another embodiment of the invention, an offset correction circuit is provided for a differential amplifier which is adapted to receive a signal $V_X$ on a first input terminal and a signal $V_Y$ on a second input terminal. The amplifier provides an output signal of a first polarity when $V_X - V_Y + V_Z$ is positive, and provides an output signal of different polarity when $V_X - V_Y + V_Z$ is negative, $V_Z$ being the offset error of the amplifier, the output signals being of the same magnitude. The offset correction circuit includes two capacitors, each having one terminal coupled to a point of reference potential, the second capacitor having a capacitance $C_2$ which is significantly larger than the capacitance $C_1$ of the first capacitor. First switching means couple the output signal of the latch to the remaining terminal of the first capacitor. Second switching means couple the first capacitor to the remaining terminal of the second capacitor. The two switching means are alternatively operative. The second capacitor is coupled, via a buffer which provides a low output impedance, through an attenuator to the second input terminal. In accordance with certain features of the invention, the ratio of $C_2$ to $C_1$ exceeds 80 to 1, as, for example, 100 or 500 to 1. The buffer can be a source follower. The attenuator includes two MOS transistors, each having their gate electrodes coupled to an activating potential. The source electrode of the first transistor is coupled to the buffer output. Its source electrode is coupled both to the drain electrode of the second MOS transistor and to the second terminal. The source electrode is coupled to a point of reference potential.

BRIEF DESCRIPTION OF THE DRAWING

Other objects, advantages, and features of this invention, together with its construction and mode of operation, will become more apparent from the following description, when read in conjunction with the accompanying drawing, in which.

DESCRIPTION OF PREFERRED EMBODIMENTS

Figure 1:
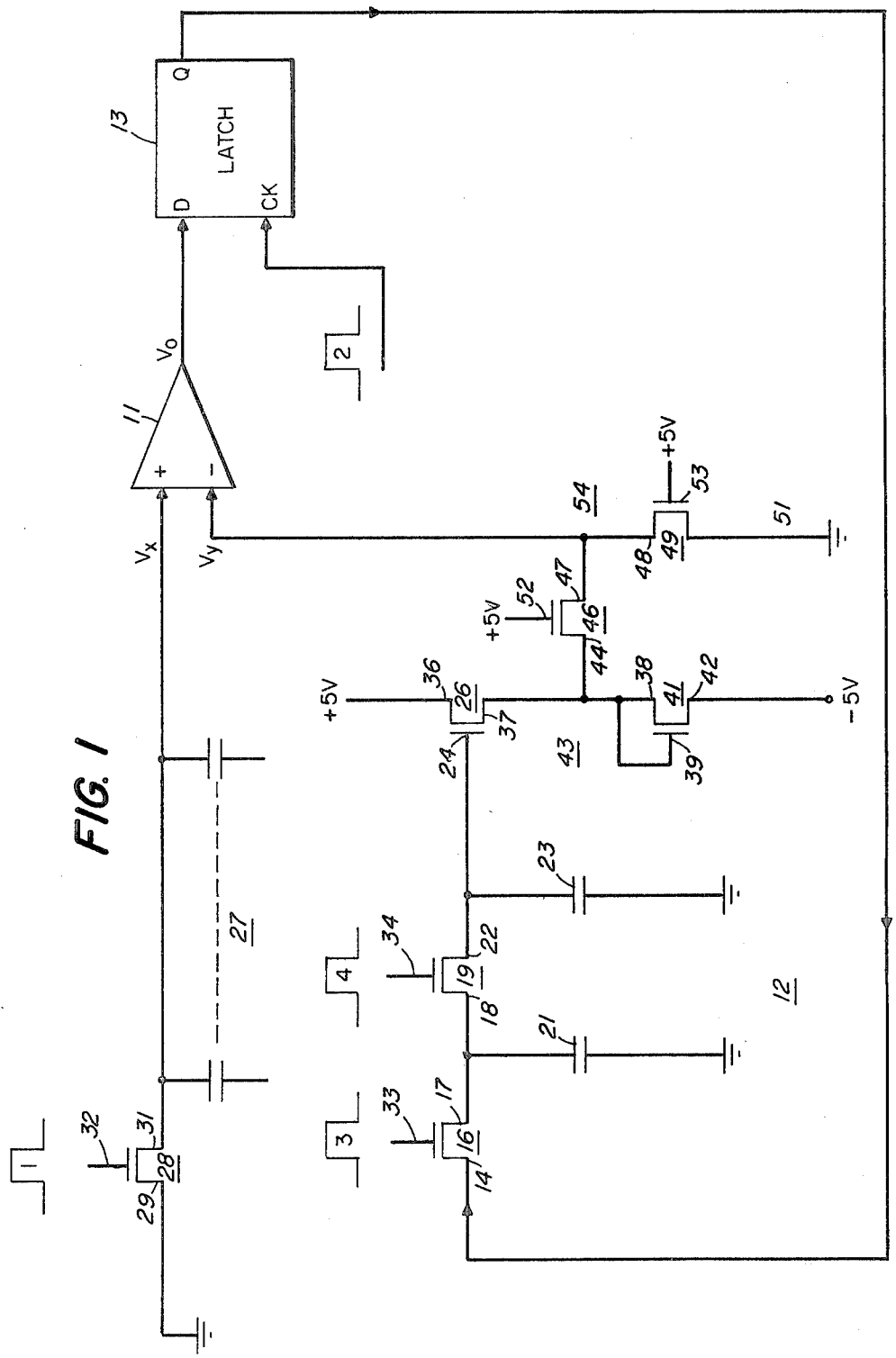
FIG. 1 is a circuit diagram of one embodiment of this invention.

Referring to FIG. 1, there is shown a block diagram of a differential amplifier 11 together with other circuitry including an offset correction circuit 12. The differential amplifier 11 operates as a comparator: One input terminal receives a signal $V_X$; a second input terminal receives a signal $V_Y$. Ideally, the output signal $V_O$ from the amplifier 11 should have a polarity based upon the polarity of $V_X - V_Y$. Actually, the output signal has a polarity based upon the polarity of $V_X - V_Y + V_Z$, where $V_Z$ is the "offset error" of the amplifier.

It is desired to obtain an accuracy of comparison as close as possible, utilizing MOS technology throughout.

Preferably, when the input voltage $V_X$ is positive, it is desired that $V_O$ be positive, and, when the input voltage $V_X$ is negative, it is desired that $V_O$ be negative. Hence, the voltage $V_Y$ is used to correct the internal imbalance caused by the offset error $V_Z$.

The embodiment depicted in FIG. 1 utilizes small voltage steps with practical values of capacitances which can be provided on integrated circuit chips.

The comparator 11 has its output $V_O$ coupled to the D input of a latching circuit 13. The Q output of the latching circuit 13 is coupled to a source electrode 14 of a MOS transistor 16 having its drain electrode 17 coupled both to a source electrode 18 of a MOS transistor 19 and to one terminal of a low capacitance capacitor 21 whose other terminal is coupled to a point of reference potential, such as ground. A drain electrode 22 of the MOS transistor 19 is coupled both to one terminal of a relatively high capacitance capacitor 23, whose other terminal is coupled to a point of reference potential such as ground, and to a gate electrode 24 of a MOS transistor 26.

Various terminals of a capacitor array 27, immaterial to this invention, are coupled to provide a $V_X$ input signal to the comparator 11. However, for offset correction purposes, an MOS transistor 28 has its source electrode 29 coupled to a point of reference potential, such as ground, its drain electrode 31 being coupled to provide the $V_X$ input signal to the amplifier 11.

Figure 2:
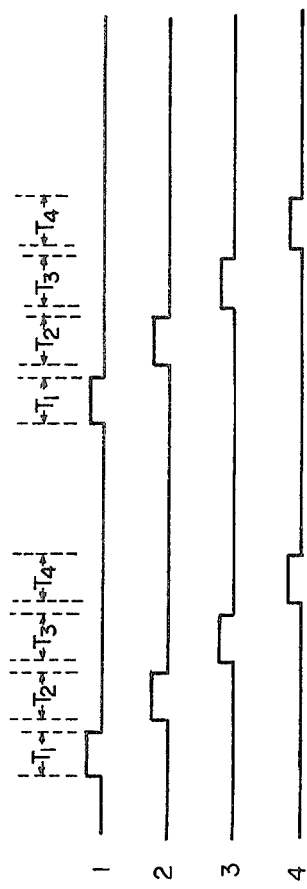
FIG. 2 is a timing diagram of various waveforms of electrical signals used in the circuit diagram of FIG. 1.

As shown in FIGS. 1 and 2, an activating timing pulse 1 is applied to a gate electrode 32 of the MOS transistor 28. A subsequent activating timing pulse 2 is applied to a clocking terminal CK of the latching circuit 13. A subsequent activating timing pulse 3 is applied to a gate electrode 33 of the MOS transistor 16, and a subsequent activating timing pulse 4 is applied to a gate electrode 34 of the MOS transistor 19.

The four pulses 1, 2, 3, and 4 are sequential and repetitive.

A positive potential, such as +5 volts, is applied to a drain electrode 36 of the MOS transistor 26. A source electrode 37 of the transistor 26 is coupled to both a drain electrode 38 and a gate electrode 39 of an MOS transistor 41 whose source electrode 42 is coupled to a point of reference potential, such as ground.

The transistors 26 and 41 act as a buffer 43.

The drain electrode 37 is further coupled to an electrode 44 of an MOS transistor 46 whose drain electrode 47 is coupled both to an electrode 48 of an MOS transistor 49 and to the second input terminal of the comparator 11 as the $V_Y$ signal. When the voltage at electrode 44 is positive, electrodes 44 and 48 act as drains and electrodes 47 and 51 act as sources. When the voltage at electrode 44 is negative, electrodes 44 and 48 act as sources and electrodes 47 and 51 act as drains.

An electrode 51 of the MOS transistor 49 is coupled to a point of reference potential, such as ground. Gate electrodes 52, 53 of the MOS transistors 46, 49, respectively, are coupled to an activating potential of +5 volts.

The transistors 46 and 49 act as an attenuator 54.

Were the comparator 11 to be perfectly symmetrical, and did not require any offset correction, the input $V_Y$ to the negative terminal would be zero. When offset correction is required, $V_Y$ is controlled so that the polarity of the comparator 11 output is the same as the polarity of $V_X$.

To explain the correction process, assume that the comparator 11 has an input offset ($V_Z$) of +10 mV. and that, initially, the correction voltage $V_Y$ is zero volt. The correction operation occurs in four steps in a cyclic manner. During the first time slot, the transistor 28 is turned on, which causes $V_X$ to be zero. Since the comparator 11 output $V_O$ is proportional to $V_X - V_Y + V_Z$, $0 - 0 + 10$ mV equals $+10$ mV, its output becomes positive.

During the second time slot, the latch 13 is clocked, storing the comparator 11 output polarity. Typically, the latch output Q is +2 volts for a logical ONE and −2 volts for a logical ZERO.

During the third time slot, the MOS transistor 16 is turned on, charging capacitor 21 (in this instance, charging to +2 volts).

During the fourth time slot, the MOS transistor 19 is turned on, thereby connecting the capacitor 21 to the capacitor 23. The final voltage across capacitor 23 is:

$$V_{2F} = \frac{C_1 V_{1i} + C_2 V_{2i}}{C_1 + C_2}$$

where $C_1$ is the capacitance of capacitor 21, $C_2$ is the capacitance of capacitor 23, $V_{1i}$ is the voltage across capacitor 21 before transistor 19 was turned on, $V_{2i}$ is the voltage across capacitor 23 before transistor 19 was turned on, and $V_{2F}$ is the final voltage across capacitor 23.

Assuming $C_1 = 0.04$ picofarads; $C_2 = 20$ picofarads; $V_{1i} = +2$ volts; and $V_{2i}$ was initially zero, $$V_{2F} = \frac{C_1 V_{1i}}{C_1 + C_2} = \frac{0.04 \, (2 \text{ volts})}{0.04 + 20} \simeq 4 \text{ mV}.$$

The voltage $V_{2F}$ is applied to the combination of the transistors 26 and 41 which acts as a buffer 43. The output of the buffer 43 is applied to the combination of the transistors 46 and 49 which typically provides a 20:1 attenuation, thereby providing a $V_Y$ of 0.2 mV. This is the end of one correction cycle.

Figure 3:
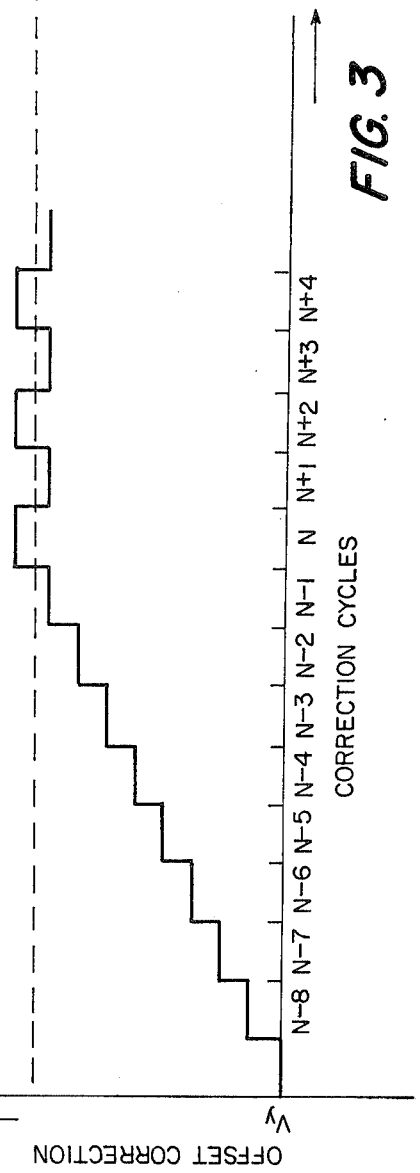
FIG. 3 is a diagram showing a relationship of offset correction versus correction cycles.

When the cycle is repeated, $V_O$ stays positive since $V_X - V_Y + V_Z = +9.8$ mV, causing $V_Y$ to become approximately 0.4 mV. This process continues, as indicated in FIG. 3, until after N cycles $V_Y$ exceeds 10 mV by a fraction of a millivolt. At cycle N+1, $V_O$ becomes negative and $V_Y$ decreases by a fraction of a millivolt. During the equilibrium state, $V_Y$ is 10 mV ± a fraction of a millivolt. The correction accuracy is directly proportional to the comparator 11 gain and inversely proportional to the correction step size. The accuracy is independent of variation in circuit parameters. However, variation in circuit parameters reduces the correction range. The buffer 43 and the attenuator 54 are designed to minimize the effects due to their variations. This preferred embodiment is designed to provide an offset correction of ±50 mV with 0.2 mV correction steps.

The foregoing embodiment is the best mode of the invention contemplated by the inventor.

Figure 4:
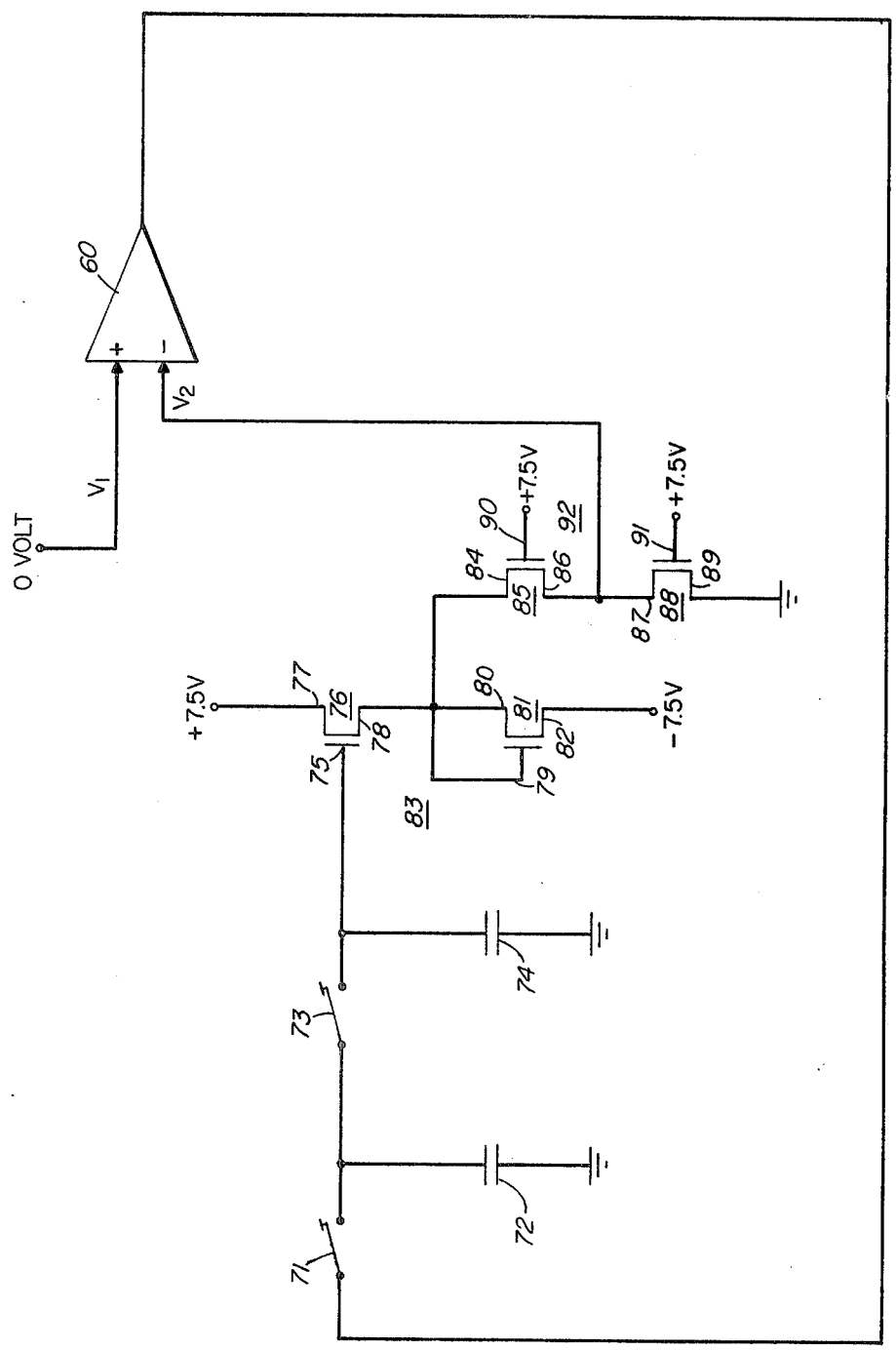
FIG. 4 is a circuit diagram of another embodiment of this invention.

Another embodiment illustrated in FIG. 4 includes a differential amplifier 60 having its positive input terminal adapted to receive zero volts as the input signal $V_1$, its negative input terminal being adapted to receive a signal $V_2$. The output of the amplifier 60, coupled as a comparator, provides a level of +3 volts or −3 volts depending upon the sign of $(V_1 - V_2 + V_Z)$, where $V_Z$ is the offset error, typically ±millivolts.

The output of the comparator 60 is coupled through a single pole-single throw switch 71 to one side of a capacitor 72, which may have a capacitance $C_1$ of 0.2 picofarads, the other side of the capacitor 72 being coupled to a point of reference potential, such as ground.

The one side of the capacitor 72 is coupled through a single-pole—single throw switch 73 to one side of a capacitor 74 having a capacitance $C_2$ of 20 picofarads, the other side of the capacitor 74 being coupled to a point of reference potential, such as ground.

The one side of the capacitor 74 is coupled to a gate electrode 75 of a MOS transistor 76 having a drain electrode 77 coupled to a positive potential, and having a source electrode 78 coupled to a gate electrode 79 and drain electrode 80 of an MOS transistor 81. A source electrode 82 of the transistor 81 is coupled to a negative potential, −7.5 volts.

The transistors 76 and 81 act as a buffer 83.

The source electrode 78 of the transistor 76 is coupled to the electrode 84 of an MOS transistor 85 having its electrode 86 coupled to an electrode 87 of an MOS transistor 88. The electrode 89 of the transistor 88 is coupled to a point of reference potential, such as ground. When the voltage at electrode 84 is positive, electrodes 84 and 87 act as drains and electrodes 86 and 89 act as sources. When the voltage at electrode 84 is negative, electrodes 84 and 87 act as sources and electrodes 86 and 89 act as drains. Both gate electrodes 90, 91 of the transistors 85, 88 are coupled to a positive activating level, +7.5 volts. The drain electrode 86 of the transistor 85 is coupled to the comparator 60 as its $V_Y$ input.

The transistors 85, 88 act as an attenuator 92.

In operation, assume, with a $V_1$ input, a positive output is obtained from the comparator 60 of +3 volts.

During a particular time slot, the switch 71 is closed, charging the capacitor 72 to +3 volts. Then, the switch 71 is opened, and the switch 73 is closed. The switch 73 connects the capacitor 72 to the capacitor 74. Since the value (in this example, 20 picofarads) of the capacitor 74 is so much larger than the capacitance (e.g., 0.2 picofarads) of the capacitor 72, the voltage across the capacitor 74 increases by about 30 millivolts $$\left( \frac{0.2 \times 3 \text{ volts}}{0.2 + 2.0} \right).$$

The 30 millivolts on the capacitor 74 is applied through the buffer 83 to the attenuator 92 which has an attenuation ratio of 100 to 1. Thus, with 30 millivolts applied to the buffer 83, an output of 0.3 millivolt is obtained from the attenuator 92 as a $V_Y$ input signal to the comparator 60.

With $V_1=0$ and $V_2=0.3$ millivolts, $V_Z$ being 10 millivolts, the offset error is so great that $V_2$ is not enough to overcome the imbalance. In the next cycle, the comparator 60 will again provide a positive output (of +3 volts). Again, the switch 71 is closed, then opened, and the switch 73 is closed, the voltage from the attenuator 92 jumping another 0.3 millivolts to 0.6 millivolts. The voltage $V_2$ continues to increase in similar fashion until it gets to the vicinity of 10 millivolts. When $V_2$ exceeds 10 millivolts (such as, for example, 10.1 millivolts), the output of the capacitor 11 becomes negative.

When the switch 71 closes, the capacitor 72 charges to −3 volts. When switch 71 is opened and the switch 73 is closed, the voltage across the capacitor 74 will be reduced fractionally by about 30 millivolts, thus reducing $V_2$ by about 0.3 millivolt.

Next, the output of the comparator 60 becomes positive, and $V_2$ is caused to increase. Then it becomes negative, and the output fluctuates, or "hunts" about the 10 millivolts correction value.

In essence, the invention utilizes a principle to charge a small capacitor 72, and then dump the charge to a large capacitor 74. The voltage increment of the capacitor 74 is a function of the ratio of the capacitances of the capacitors 72, 74 and not the absolute value of the capacitors 72, 74.

In summary, expressed in other words, assume that the comparator 60 (FIG. 4) has an offset of 10 mV. Assume also that initially the charge on C1 and C2 (capacitors 72, 74) is zero which makes $V_2=0$. Thus the input to switch 71 becomes (0−0+10 mV) positive. (The output of the comparator 60 is amplified and amplitude limited to ±3 volts.) Thus, the input to switch 71 is +3 volts.

First, switch 71 is closed with switch 73 remaining open. This causes capacitor 72 (C1) to charge to +3 volts. Then switch 71 is opened and switch 73 closed. This causes capacitor 74 (C2) to charge. The voltage on capacitor 74 (C2) becomes $C1/(C1+C2)=30$ mV.

This is applied to transistors 76 and 81 which provide a low output impedance without putting a shunt resistor across capacitor 74. The transistors 76, acts as a source follower. Transistor 76 is a depletion type to allow zero voltage drop between the gate 75 and source 77 of transistor 76. The transistors 85 and 88 form an attenuator 92 which in this case has an attenuation of 100. (This attenuator 92 cannot be placed directly across capacitor 74 because the charge would leak off. Hence, the need for the impedance transformation provided by the transistors 76 and 81.) Note that conventional MOS attenuators operate to one polarity voltage only. This attenuator operates for positive and negative voltages. Thus, with a 30 mV input to the gate 75 of transistor 76, $V_2$ becomes 30 mV/100 =0.3 mV. The sign of the comparator 60 output is now determined by $V_1-V_2+10$ mV=0−0.3 mV +10 mV=9.7 mV. Therefore, the comparator 60 output remains at 3 volts.

When switches 71 and 73 are activated a second time, the voltage on the capacitor 74 becomes approximately 60 mV and $V_2$ becomes 0.6 mV. The resulting comparator output remains +3 volts. This process continues until the capacitor 74 charges to approximately 1 volt and $V_2$ to 10 mV. The resulting comparator output polarity is determined by $V_1-V_2+10$ mV=0−10 mV+10 mV=0 volt. (The comparator output is used to trigger a latch so that the latch output must be positive or negative. It cannot be zero.)

If the comparator 60 output is still +3, then the next activation of switches 71 and 73 make $V_2>10$ mV and the comparator 60 output becomes negative. The following activation of switches 71 and 73 will make $V_2<10$ mV and the comparator 60 output positive. This process continues with $V_2$ fluctuating about 10 mV±0.3 mV., and the zero offset has been corrected to within ±0.3 mV. Switches 71 and 73 are MOS switches. Any drift in the comparator offset, transistors 76, 81, 85, 88 will cause a change in the accumulated charge of capacitor 74 until a new equilibrium is established.

Various modifications will become apparent to those skilled in the art without departing from the spirit and scope of this invention. For example, it will be apparent to those in the art that various elements specified herein can take various configurations in electronic systems. Although MOS transistors are referred to, it is to be understood that similar circuits are obtainable within integrated circuits, including LSIC or VLSIC (large or very large scale integrated circuits). Thus, it is intended that the invention be limited solely by the scope of the appended claims.

What is claimed is:

1. In combination,
    differential amplifier means having a first input terminal for receiving a signal $V_X$, a second input terminal for receiving a signal $V_Y$, and an output terminal, said output terminal being adapted to provide an output signal therefrom based upon the polarity of $(V_X-V_Y+V_Z)$, wherein $V_Z$ is an offset error of said amplifier; and
    an offset correction circuit comprising
        a latching circuit coupled to receive said output signal and store its polarity, said latching circuit providing a positive latching signal upon receipt of an output signal of a first polarity from said amplifier and providing a negative latching signal upon receipt of an output signal of a second polarity from said amplifier;
        a first capacitor, having a capacitance $C_1$, having one terminal coupled to a first point of reference potential, and having a second terminal;
        a second capacitor having a capacitance $C_2$, wherein $C_2$ is larger than $C_1$, having one terminal coupled to a second point of reference potential, and having a second terminal;
        means operative during a first time period for causing said first input terminal to be at a third point of reference potential;
        means operative during a second time period for storing the polarity of said output signal;
        means operative during a third time period for charging said first capacitor, via its second terminal, with a latching signal from said latching circuit;
        means operative during a fourth time period for coupling said first capacitor second terminal to said second capacitor second terminal;
        buffer means, having an input terminal coupled to said second capacitor second terminal, for providing a low output impedance onto an output terminal therof; and
        attenuation means coupling said buffer means output terminal to said second input terminal.

2. The combination as recited in claim 1 wherein said positive latching signal and said negative latching signal are each of a fixed magnitude.

3. The combination as recited in claim 1 wherein said positive latching signal and said negative latching signal are each of the same fixed magnitude.

4. The combination as recited in claim 1 wherein said capacitance $C_2$ is significantly larger than said capacitance $C_1$.

5. The combination as recited in claim 1 wherein the ratio of $C_2$ to $C_1$ exceeds 80 to 1.

6. The combination as recited in claim 5 wherein $C_2/C_1$ is 100.

7. The combination as recited in claim 5 wherein $C_2/C_1$ is 500.

8. The combination as recited in claim 1 wherein said first point of reference potential and said second point of reference potential are identical.

9. The combination as recited in claim 8 wherein said first point of reference potential and said second point of reference potential are each at zero potential.

10. The combination as recited in claim 1 wherein said third point of reference potential is at zero potential.

11. The combination as recited in claim 1 wherein said buffer means is a source follower.

12. The combination as recited in claim 1 wherein said attenuation means includes
    first MOS transistor means having a source electrode coupled to said buffer means output terminal, a gate electrode adapted to be coupled to an activating potential, and a drain electrode; and
    second MOS transistor means having a source electrode coupled both to said first MOS transistor means drain electrode and to said second input terminal, a gate electrode adapted to be coupled to an activating potential, and a drain electrode adapted to be coupled to a fourth point of reference potential.

13. The combination as recited in claim 12 wherein said third point of reference potential and said fourth point of reference potential are identical.

14. The combination as recited in claim 1 wherein said first time period, said second time period, said third time period, and said fourth time period are sequential and repetitive.

15. An offset correction circuit for differential amplifier means, said means being adapted to receive a signal $V_X$ on a first input terminal and a signal $V_Y$ on a second input terminal and adapted to provide an output signal of a first polarity when $(V_X-V_Y+V_Z)$ is positive and to provide an input signal of a different polarity when $(V_X-V_Y+V_Z)$ is negative, wherein $V_Z$ is an offset error of said amplifier means, and wherein the output signals of said first polarity and said different polarity and of the same fixed magnitude, said offset correction circuit comprising
    a first capacitor, having a capacitance $C_1$, having one terminal coupled to a first point of reference potential, and having a second terminal;
    a second capacitor, having a capacitance $C_2$, wherein $C_2$ is significantly larger than $C_1$, having one terminal coupled to a second point of reference potential, and having a second terminal;
    first switching means for coupling the output signal of said amplifier means to said first capacitor second terminal;
    second switching means for coupling said first capacitor second terminal to said second capacitor second terminal, said first switching means and said second switching means being alternately operative;
    buffer means, having an input terminal coupled to said second capacitor second terminal, for providing a low output impedance onto an output terminal thereof; and
    attenuation means coupling said buffer means output terminal to said second input terminal.

16. The circuit as recited in claim 15 wherein the ratio of $C_2$ to $C_1$ exceeds 80 to 1.

17. The circuit as recited in claim 16 wherein $C_2/C_1$ is 100.

18. The circuit as recited in claim 16 wherein $C_2/C_1$ is 500.

19. The circuit as recited in claim 15 wherein said first point of reference potential and said second point of reference potential are identical.

20. The circuit as recited in claim 19 wherein said first point of reference potential and said second point of reference potential are each at zero potential.

21. The circuit as recited in claim 15 wherein said buffer means is a source follower.

22. The circuit as recited in claim 15 wherein said attenuation means includes first MOS transistor means having a source electrode coupled to said buffer means output terminal, a gate electrode adapted to be coupled to an activating potential, and a drain electrode; and second MOS transistor means having a source electrode coupled both to said first MOS transistor means drain electrode and to said second terminal, a gate electrode adapted to be coupled to an activating potential, and a drain electrode adapted to be coupled to a point of reference potential.

23. The circuit as recited in claim 22 wherein said second MOS transistor means drain electrode is coupled to a point of zero potential.

* * * * *